(12) United States Patent
Kang et al.

(10) Patent No.: US 8,158,979 B2
(45) Date of Patent: Apr. 17, 2012

(54) ORGANIC LIGHT EMITTING DISPLAY AND METHOD OF MANUFACTURING THE SAME

(75) Inventors: Ki-Nyeng Kang, Yongin (KR); Young-Shin Pyo, Yongin (KR); Dong-Un Jin, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 116 days.

(21) Appl. No.: 12/833,785

(22) Filed: Jul. 9, 2010

(65) Prior Publication Data

US 2011/0101330 A1    May 5, 2011

(30) Foreign Application Priority Data

Nov. 4, 2009   (KR) .................. 10-2009-0105986

(51) Int. Cl.
*H01L 33/28* (2010.01)

(52) U.S. Cl. ...................................................... 257/43

(58) Field of Classification Search ................ 257/43, 257/72, 66, 223, 227, 291, 292, 439, 443, 257/655, E21.7, E27.1, E27.125, E27.112, 257/E29.117, E29.145, E29.147, E29.151, 257/E29.182, E29.202, E29.273–E29.299, 257/E29.314, E29.32, E23.016, E21.094, 257/E21.401, E21.121, E21.372, E21.411–E21.416, 257/E33.053, E29.094, 59, E33.022, E33.068, 257/E29.003; 438/149, 163

See application file for complete search history.

(56) References Cited

U.S. PATENT DOCUMENTS

| 7,247,529 B2 * | 7/2007 | Shoji et al. ..................... 438/166 |
| 7,560,732 B2 * | 7/2009 | Yamazaki et al. .............. 257/59 |
| 7,851,245 B2 * | 12/2010 | Jun et al. .......................... 438/48 |
| 8,017,950 B2 * | 9/2011 | Joo ................... 257/72 |
| 8,044,401 B2 * | 10/2011 | Yang et al. ....................... 257/66 |
| 2006/0197092 A1 | 9/2006 | Hoffman et al. |
| 2007/0152223 A1 * | 7/2007 | Kang et al. ..................... 257/72 |
| 2008/0042138 A1 * | 2/2008 | Park et al. ..................... 257/72 |
| 2008/0048191 A1 * | 2/2008 | Son ................... 257/72 |
| 2008/0299861 A1 | 12/2008 | Ishihara et al. |
| 2009/0050894 A1 * | 2/2009 | Park et al. ..................... 257/72 |
| 2009/0189160 A1 * | 7/2009 | Ahn et al. ....................... 257/66 |
| 2009/0289258 A1 * | 11/2009 | Kim et al. ....................... 257/66 |
| 2009/0321732 A1 * | 12/2009 | Kim et al. ....................... 257/43 |
| 2010/0006845 A1 * | 1/2010 | Seo et al. ....................... 257/59 |
| 2010/0038643 A1 * | 2/2010 | Park et al. ....................... 257/59 |

(Continued)

FOREIGN PATENT DOCUMENTS

JP    2003 303687    10/2003

(Continued)

OTHER PUBLICATIONS

Office Action dated Oct. 20, 2011 in Korean Priority Application No. 10-2009-0105986.

(Continued)

*Primary Examiner* — Dao H Nguyen
*Assistant Examiner* — Tram H Nguyen
(74) *Attorney, Agent, or Firm* — Knobbe Martens Olson & Bear, LLP

(57) ABSTRACT

An organic light emitting display is disclosed. The display comprises a transistor with an active layer comprising an oxide semiconductor material. The oxide semiconductor material has conductivity suitable for the transistor because of a diffusion path allowing hydrogen to escape from the active layer.

15 Claims, 4 Drawing Sheets

U.S. PATENT DOCUMENTS

| | | |
|---|---|---|
| 2010/0065845 A1 | 3/2010 | Nakayama |
| 2010/0065849 A1* | 3/2010 | Lee et al. .................. 257/72 |
| 2011/0006306 A1* | 1/2011 | Yamazaki et al. .............. 257/72 |
| 2011/0104833 A1* | 5/2011 | Kang et al. ..................... 438/23 |
| 2011/0127519 A1* | 6/2011 | Kang et al. ..................... 257/43 |

FOREIGN PATENT DOCUMENTS

| | | |
|---|---|---|
| JP | 2007-73699 | 3/2007 |
| JP | 2008 134625 | 6/2008 |
| JP | 2009 31742 | 2/2009 |
| JP | 2009-99953 | 5/2009 |
| KR | 1020090105560 | 10/2009 |

OTHER PUBLICATIONS

Office Action dated Jan. 31, 2012 in corresponding Japanese Patent Application No. 2010-031410.

* cited by examiner

ORGANIC LIGHT EMITTING DISPLAY AND METHOD OF MANUFACTURING THE SAME

CROSS-REFERENCE TO RELATED APPLICATION

This application claims priority to and the benefit of Korean Patent Application No. 10-2009-0105986, filed on Nov. 4, 2009, in the Korean Intellectual Property Office, the entire content of which is incorporated herein by reference.

BACKGROUND

1. Field

The field relates to an organic light emitting display and a method of manufacturing the same, and more particularly, to an organic light emitting display including a thin film transistor (TFT) in which oxide semiconductor is used as an active layer and a method of manufacturing the same.

2. Description of the Related Technology

A thin film transistor (TFT) includes an active layer providing a channel region, a source region, and a drain region and a gate electrode insulated from the active layer of the channel region by a gate insulating layer.

The active layer of the TFT is made of semiconductor such as amorphous silicon or poly-silicon. When the active layer is made of amorphous silicon, mobility is low so that it is difficult to realize a driving circuit driven at high speed. When the active layer is made of poly-silicon, since mobility is high but a threshold voltage is not uniform, a compensation circuit must be added.

In addition, it is difficult to apply a conventional TFT manufacturing method using low temperature poly-silicon (LTPS) to a large area substrate since a high-price process such as laser heat treatment is included and TFT characteristic control is difficult.

In order to solve the above-described problems, research on using an oxide semiconductor as the active layer have been recently performed.

In Japanese Patent Publication No. 2004-273614, a TFT in which an oxide semiconductor using zinc oxide (ZnO) as a main component is used as the active layer is disclosed.

Since the oxide semiconductor having ZnO used as the main component is amorphous and has an N-type semiconductor characteristic, the TFT may be manufactured by the conventional LTPS process and an ion injection process may be omitted. Therefore, manufacturing processes and cost may be reduced.

However, the oxide semiconductor has a disadvantage in that an electric characteristic varies significantly in accordance with structure and processing conditions. In particular, variation in the threshold voltage Vth among the many pixels of a display is caused by variation in the characteristics of the oxide semiconductor. As a result, the picture quality and reliability of the organic light emitting display suffer.

SUMMARY OF CERTAIN INVENTIVE ASPECTS

One aspect is an organic light emitting display including a substrate, a gate electrode formed on the substrate, a first insulating layer on the gate electrode, and an active layer including an oxide semiconductor material on the first insulating layer and the gate electrode. The display also includes a second insulating layer on the active layer, source and drain electrodes on the second insulating layer coupled to the active layer, and a third insulating layer including an organic material on the source and drain electrodes and on the second insulator. The display also includes an anode electrode on the third insulating layer electrically coupled to the source or drain electrode, a pixel defining layer on the anode electrode and the third insulator patterned so that the anode electrode in an emission region is exposed, an organic light emitting layer formed on the exposed anode electrode, and a cathode electrode formed on the organic light emitting layer, where the anode electrode does not overlap the active layer.

Another aspect is a method of manufacturing an organic light emitting display. The method includes forming a gate electrode on a substrate, forming a first insulating layer over the gate electrode, forming an active layer including an oxide semiconductor material on the first insulating layer and the gate electrode, and forming a second insulating layer over the active layer. The method also includes forming source and drain electrodes coupled to the active layer over the second insulating layer, forming a third insulating layer including an organic material over the source and drain electrodes, patterning the third insulating layer to expose the source or drain electrode, and bathing the third insulating layer and the exposed source or drain electrode. The method also includes forming a first electrode over the third insulating layer, the first electrode being coupled to the exposed source or drain electrode, where the first electrode does not to overlap the active layer, forming a pixel defining layer over third insulating layer and the first electrode, where the pixel defining layer exposes the first electrode in an emission region, and forming an organic light emitting layer over the exposed first electrode, and forming a second electrode on the organic light emitting layer.

Another aspect is a method of fabricating an organic light emitting display. The method includes forming source and drain electrodes of a first thin film transistor and a gate electrode of a second thin film transistor on a substrate, and forming a first insulation layer on the source and drain electrodes of the first thin film transistor and on the gate electrode of the second thin film transistor. The method also includes forming first via holes in the first insulation layer to expose the source and drain electrodes of the first thin film transistor, and forming first and second oxide semiconductor layers on the first insulation layer over the source and drain electrodes of the first thin film transistor and on the first insulation layer over the gate electrode of the second thin film transistor, respectively. The method also includes forming a second insulation layer on the first and second oxide semiconductor layers, forming second via holes in the second insulation layer to expose the second oxide semiconductor layer, forming a gate electrode on the second insulation layer over the first oxide semiconductor layer of the first thin film transistor, and forming source and drain electrodes on the second insulation layer to contact the second oxide semiconductor layer through the second via holes.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF CERTAIN INVENTIVE EMBODIMENTS

Figure 1:
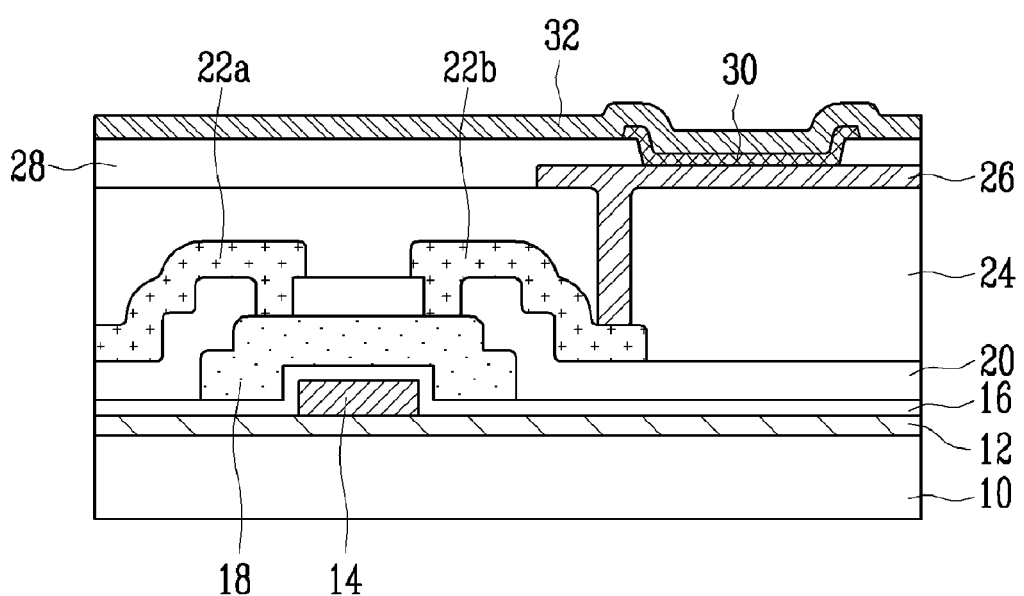
FIG. 1 is a cross-sectional view illustrating an organic light emitting display.

In the following detailed description, certain exemplary embodiments are shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the another element with one or more intervening elements interposed therebetween. Hereinafter, like reference numerals generally refer to like elements.

Hereinafter, various aspects of certain embodiment are be described in detail with reference to the accompanying drawings.

FIG. 1 is a cross-sectional view illustrating an organic light emitting display according to the present invention.

Referring to FIG. 1, a buffer layer 12 is formed on a substrate 10. A gate electrode 14 is formed on the buffer layer 12. A first insulating layer 16 is formed on the buffer layer 12 and the gate electrode 14. An active layer 18 comprising an oxide semiconductor material is formed on the first insulating layer 16 over the gate electrode 14. A second insulating layer 20 is formed on the first insulating layer 16 and the active layer 18. Source and drain electrodes 22a and 22b are formed on the second insulating layer 20 and are coupled to the active layer 18.

A third insulating layer 24 made of an organic material is formed on the second insulating layer 20 and the source and drain electrodes 22a and 22b. An anode electrode 26 is formed on the third insulating layer 24 and is coupled to a source or drain electrode 22a or 22b and does not overlap the active layer 18.

A pixel defining layer 28 is formed on the third insulating layer 24 and the anode electrode 26 and is patterned to expose the anode electrode 26 in an emission region. An organic light emitting layer 30 is formed on the exposed anode electrode 26. A cathode electrode 32 is formed on the pixel defining layer 28 and the organic light emitting layer 30.

FIGS. 2A to 2E are sectional views illustrating a method of manufacturing the organic light emitting display of FIG. 1.

Figure 2A:
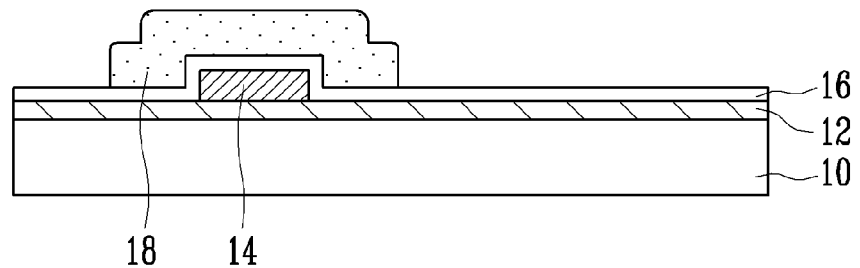
FIGS. 2A to 2E are cross-sectional views illustrating a method of manufacturing the organic light emitting display according to the present invention.

Referring to FIG. 2A, the buffer layer 12 and a metal layer are formed on an insulating substrate 10 made of a transparent material, such as glass or plastic, and the metal layer is patterned to form the gate electrode 14. The first insulating layer 16 and an oxide semiconductor layer are formed on the buffer layer 12 and the gate electrode 14, and the oxide semiconductor layer is patterned to form the active layer 18 on the first insulating layer 16 and gate electrode 14.

The metal layer comprises a metal, such as W, Ti, Mo, Ag, Ta, Al, Cu, Au, Cr, and Nb or an alloy of the above metals. The oxide semiconductor layer comprises, for example, ZnO or ZnO doped with, for example, any of In, Ga, Hf, and Sn, for example, InZnO (IZO), GaInZnO (GIZO), and HfInZnO.

Figure 2B:
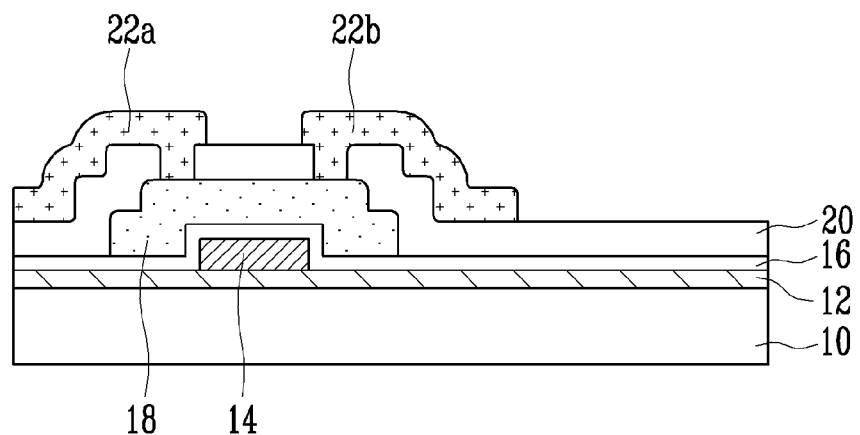

Referring to FIG. 2B, the insulating layer 20 is formed on the first insulating layer 16 and the active layer 18, and a contact hole is formed so that the source and drain regions of the active layer 18 are exposed. After forming a metal layer on the second insulating layer 20 to contact the exposed regions, the metal layer is patterned to form the source and drain electrodes 22a and 22b. The metal layer comprises, for example, a metal, such as W, Ti, Mo, Ag, Ta, Al, Cu, Au, Cr, and Nb or an alloy thereof.

In a process of patterning the metal layer, in order to form the source and drain electrodes 22a and 22b, the second insulating layer 20 may be used as an etch stop layer. The patterning process may, for example include dry etching. However, because the second insulating layer 20 is formed on the active layer 18 in a channel region, the second insulating layer 20 may prevent certain electric characteristics of the TFT from being harmed due to damage of the active layer 18.

Figure 2C:
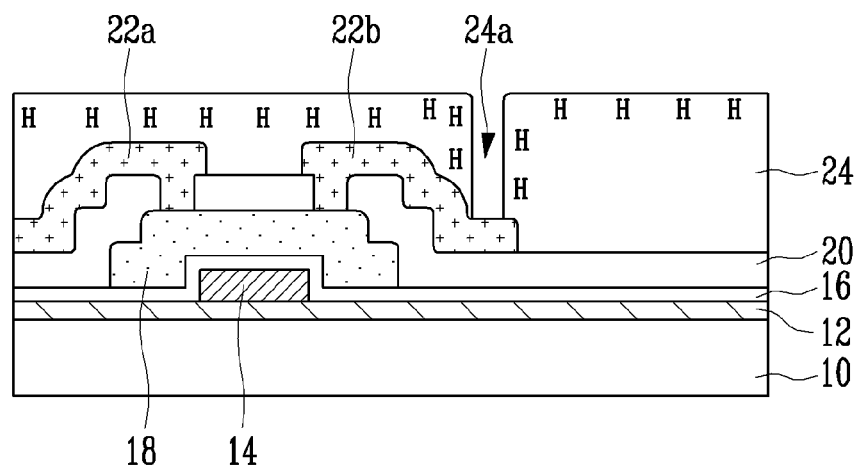

Referring to FIG. 2C, a third insulating layer 24 is formed on the second insulating layer 20 and the source and drain electrodes 22a and 22b. In some embodiments, the third insulating layer 24 may be planarized. The third insulating layer 24 may comprise an organic material such as acrylic and polyimide. In some embodiments, an inorganic material insulating layer (not shown) may first be formed on the second insulating layer 20, and the third insulating layer 24 may be formed on the inorganic insulating layer.

The third insulating layer 24 is patterned to form a via hole 24a so that the source or drain electrode 22a or 22b is exposed and a bathing process is performed. In some embodiments, the bathing process includes bathing the third insulating layer 24 and the exposed source or drain electrode 22a or 22b. In some embodiments, the bathing process removes etching residues and contaminants. When a solution including H (hydrogen ions), such as $H_2O$ is included in the bathing solution, H may permeate the third insulating layer 24.

Figure 2D:
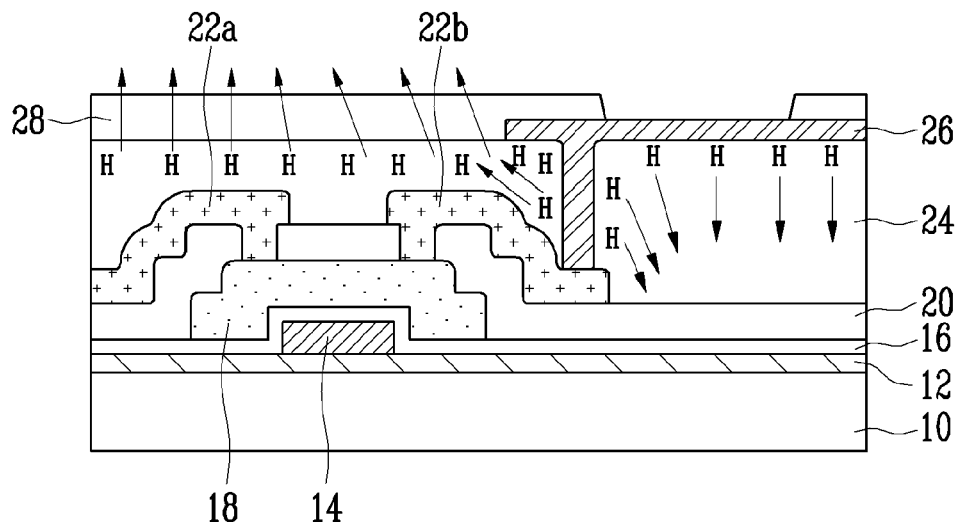

Referring to FIG. 2D, after forming a transparent conductive layer, such as indium tin oxide (ITO) and indium zinc oxide (IZO) on the third insulating layer 24 so as to contact the source or drain electrode 22a or 22b. The transparent conductive layer is patterned to form the anode electrode 26. As shown, the anode electrode 26 does not overlap the active layer 18.

After forming the pixel defining layer 28 on the third insulating layer 24 and the anode electrode 26, the pixel defining layer 28 is patterned to expose the anode electrode 26 in the emission region. The pixel defining layer 28 may be formed by coating, after which a heat treatment process may be performed.

In the heat treatment process, H that permeates the third insulating layer 24 near the transistor is diffused to the outside. Accordingly, the active layer 18 is not affected by the H. In addition, H under the anode electrode 26 is not diffused to the outside.

If H were to diffuse into the oxide semiconductor layer 18 in sufficient quantity, carrier density would increase so that the oxide semiconductor layer 18 would be too conductive, the threshold voltage Vth of the transistor would be affected and the oxide semiconductor layer 18 may not be useful for the thin film transistor (TFT).

Therefore, in order to promote the diffusion of H to the outside, the heat treatment may be included.

Figure 2E:
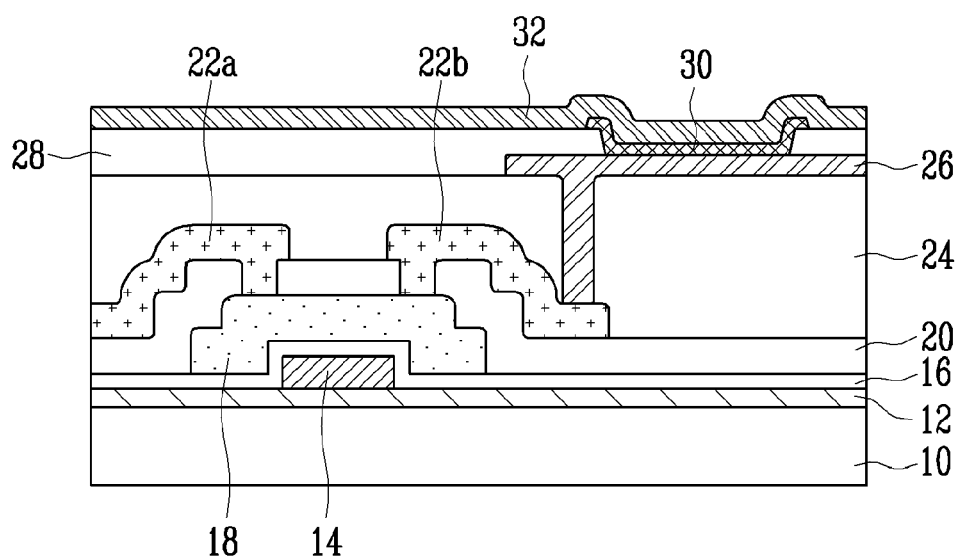

Referring to FIG. 2E, the organic light emitting layer 30 is formed on the exposed anode electrode 26 in the emission region and the cathode electrode 32 is formed on the pixel defining layer 28 and the organic light emitting layer 30.

Figure 3A:
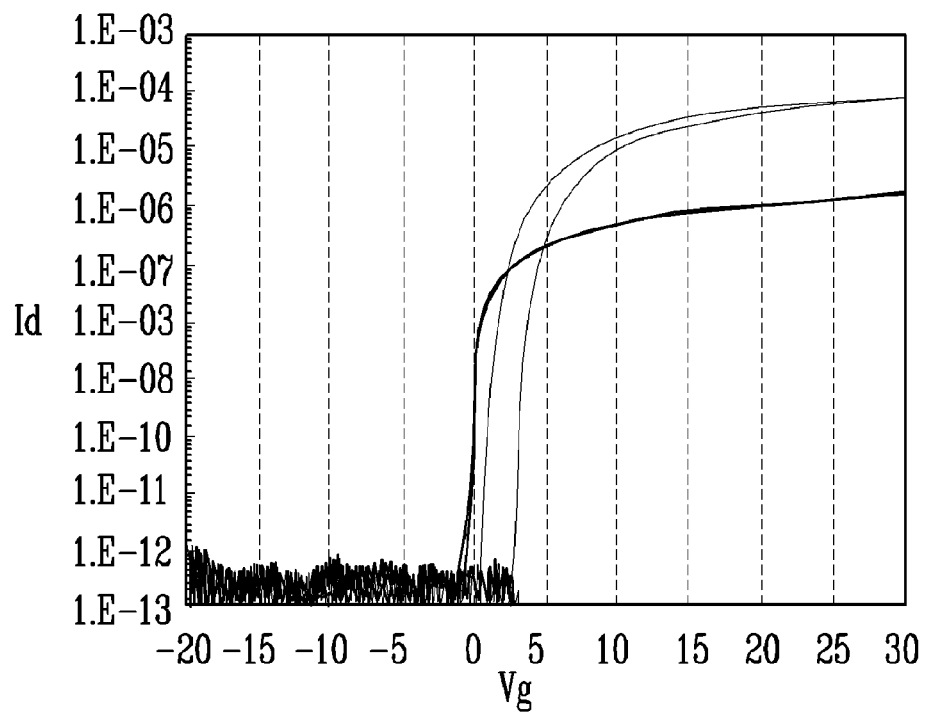
FIGS. 3A and 3B are graphs measuring a change in drain current Id in accordance with a gate voltage Vg.
Figure 3B:
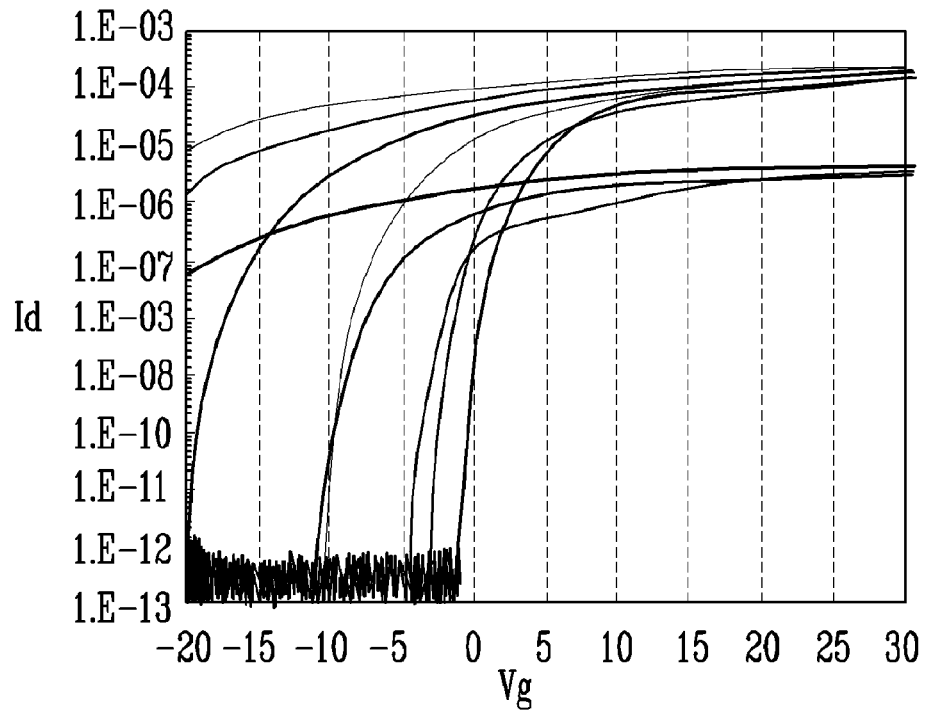

FIG. 3A is a graph showing the threshold voltage characteristic of TFTs having the structure according to FIG. 1, in which the anode electrode 26 does not overlap or encapsulate the active layer 18. FIG. 3B is a graph showing the threshold voltage characteristic of TFTs having the structure in which the anode electrode overlaps or encapsulates the active layer.

As shown in the drain current Id vs. gate voltage Vg graphs, the TFTs having the structure of FIG. 1 has a stable threshold voltage characteristic, and the TFTs having a structure in which the anode electrode overlaps the active layer, the threshold voltage is unstable because of the conductivity of the active layer.

In the organic light emitting display, when a voltage is applied to the anode electrode 26 and the cathode electrode 32, the holes injected through the anode electrode 26 recombine with the electrons injected through the cathode electrode 32 in the organic light emitting layer 30. The light emitted from the organic light emitting layer 30 is projected to the outside to display characters or an image.

In the present organic light emitting display, because the electric characteristic of the oxide semiconductor layer does not change in the manufacturing processes, a stable threshold voltage characteristic is achieved. Therefore, the present organic light emitting display having high picture quality and reliability may be realized.

While the present invention has been described in connection with certain exemplary embodiments, it is to be understood that the invention is not limited to the disclosed embodiments, but, on the contrary, is intended to cover various modifications and equivalent arrangements.

What is claimed is:

1. An organic light emitting display comprising:
   a substrate;
   a gate electrode formed on the substrate;
   a first insulating layer on the gate electrode;
   an active layer comprising an oxide semiconductor material on the first insulating layer and the gate electrode;
   a second insulating layer on the active layer;
   source and drain electrodes on the second insulating layer coupled to the active layer;
   a third insulating layer comprising an organic material on the source and drain electrodes and on the second insulator;
   an anode electrode on the third insulating layer electrically coupled to the source or drain electrode;
   a pixel defining layer on the anode electrode and the third insulator patterned so that the anode electrode in an emission region is exposed;
   an organic light emitting layer formed on the exposed anode electrode; and
   a cathode electrode formed on the organic light emitting layer,
   wherein the anode electrode does not overlap the active layer.

2. The organic light emitting display as claimed in claim 1, wherein the oxide semiconductor material comprises ZnO.

3. The organic light emitting display as claimed in claim 2, wherein the oxide semiconductor material is doped with at least one of Ga, In, and Sn.

4. The organic light emitting display as claimed in claim 1, wherein the organic material comprises acrylic or polyimide.

5. A method of manufacturing an organic light emitting display, the method comprising:
   forming a gate electrode on a substrate;
   forming a first insulating layer over the gate electrode;
   forming an active layer comprising an oxide semiconductor material on the first insulating layer and the gate electrode;
   forming a second insulating layer over the active layer;
   forming source and drain electrodes coupled to the active layer over the second insulating layer;
   forming a third insulating layer comprising an organic material over the source and drain electrodes;
   patterning the third insulating layer to expose the source or drain electrode;
   bathing the third insulating layer and the exposed source or drain electrode;
   forming a first electrode over the third insulating layer, the first electrode being coupled to the exposed source or drain electrode, wherein the first electrode does not to overlap the active layer;
   forming a pixel defining layer over third insulating layer and the first electrode, wherein the pixel defining layer exposes the first electrode in an emission region;
   forming an organic light emitting layer over the exposed first electrode; and
   forming a second electrode on the organic light emitting layer.

6. The method as claimed in claim 5, wherein the oxide semiconductor material comprises ZnO.

7. The method as claimed in claim 6, wherein the oxide semiconductor material is doped with at least one of Ga, In, Hf, and Sn.

8. The method as claimed in claim 5, wherein the organic material comprises acrylic or polyimide.

9. The method as claimed in claim 5, wherein $H_2O$ is used in the bathing.

10. The method as claimed in claim 9, wherein H diffuses into the third insulating layer during the bathing.

11. The method as claimed in claim 10, wherein H diffuses out of the third insulating layer over the active layer after the bathing.

12. The method as claimed in claim 11, wherein H is prevented by the first electrode from diffusing out of the third insulating layer in an area not over the active area.

13. The method as claimed in claim 5, further comprising forming a diffusion path for H from the active area through the second and third insulating layers, the diffusion path being substantially perpendicular to a plane defined by the substrate.

14. The method as claimed in claim 5, further comprising planarizing the third insulating layer.

15. The method as claimed in claim 5, further comprising performing a heat treatment after forming the pixel defining layer.

* * * * *